United States Patent
Lee et al.

(10) Patent No.: US 10,985,527 B2
(45) Date of Patent: Apr. 20, 2021

(54) LASER DIODE SURFACE MOUNTING STRUCTURE

(71) Applicants: Hsun-Fu Lee, Taoyuan (TW); Hou-Chieh Lee, Taoyuan (TW)

(72) Inventors: Hsun-Fu Lee, Taoyuan (TW); Hou-Chieh Lee, Taoyuan (TW)

( * ) Notice: Subject to any disclaimer, the term of this patent is extended or adjusted under 35 U.S.C. 154(b) by 0 days.

(21) Appl. No.: 16/178,579

(22) Filed: Nov. 1, 2018

(65) Prior Publication Data

US 2019/0372304 A1    Dec. 5, 2019

(30) Foreign Application Priority Data

Jun. 4, 2018    (CN) .......................... 201810564844.7

(51) Int. Cl.
| H01S 5/022 | (2021.01) |
|---|---|
| H01S 5/024 | (2006.01) |
| H01S 5/40 | (2006.01) |
| H01S 5/042 | (2006.01) |
| H01S 5/02208 | (2021.01) |
| H01S 5/02325 | (2021.01) |
| H01S 5/02345 | (2021.01) |

(52) U.S. Cl.
CPC ...... *H01S 5/02469* (2013.01); *H01S 5/02208* (2013.01); *H01S 5/02325* (2021.01); *H01S 5/02345* (2021.01); *H01S 5/0425* (2013.01); *H01S 5/4018* (2013.01); *H01S 5/4031* (2013.01)

(58) Field of Classification Search
CPC ............. H01S 5/02216; H01S 5/02256; H01S 5/02272; H01S 5/0224; H01S 5/02292
See application file for complete search history.

(56) References Cited

U.S. PATENT DOCUMENTS

| 5,903,584 | A * | 5/1999 | Jiahn-Chang | ....... H01S 5/02248 372/33 |
|---|---|---|---|---|
| 2001/0005013 | A1 * | 6/2001 | Nagamatsu | ............ G11C 29/76 257/1 |
| 2001/0038101 | A1 * | 11/2001 | Nemoto | ................... H01L 27/15 257/89 |
| 2002/0121671 | A1 * | 9/2002 | Wakisaka | ............ H01S 5/02276 257/467 |
| 2002/0181526 | A1 * | 12/2002 | Gao | .................... H01S 5/02276 372/45.01 |
| 2006/0006509 | A1 * | 1/2006 | Aizawa | ............... H01S 5/02244 257/678 |

(Continued)

*Primary Examiner* — Michael Carter
(74) *Attorney, Agent, or Firm* — Hannah Tien

(57) ABSTRACT

A laser diode surface mounting structure, having at least one edge-emitting laser diode chip, including two electrodes; a heat-dissipating plate for carrying one of the two electrodes of the at least one edge-emitting laser diode chip, which has a top conductive layer, a bottom conductive layer, and at least one conductive through hole extending from the top conductive layer to the bottom conductive layer for electrically conducting; two or more metal plates spaced apart from each other and located on a plane, wherein a first metal plate is located under the heat-dissipating plate and in contact with the bottom conductive layer of the heat-dissipating plate, and a second metal plate is located adjacent to and separated from the first metal plate; and an insulating frame having an opening and being disposed above the two or more metal plates for holding the two or more metal plates.

18 Claims, 5 Drawing Sheets

(56) References Cited

U.S. PATENT DOCUMENTS

2008/0067654 A1\* 3/2008 Sakaguchi ............ H01L 23/047
 257/680
2013/0039374 A1\* 2/2013 Lutgen ................ H01S 5/02288
 372/43.01

\* cited by examiner

Fig. 1A
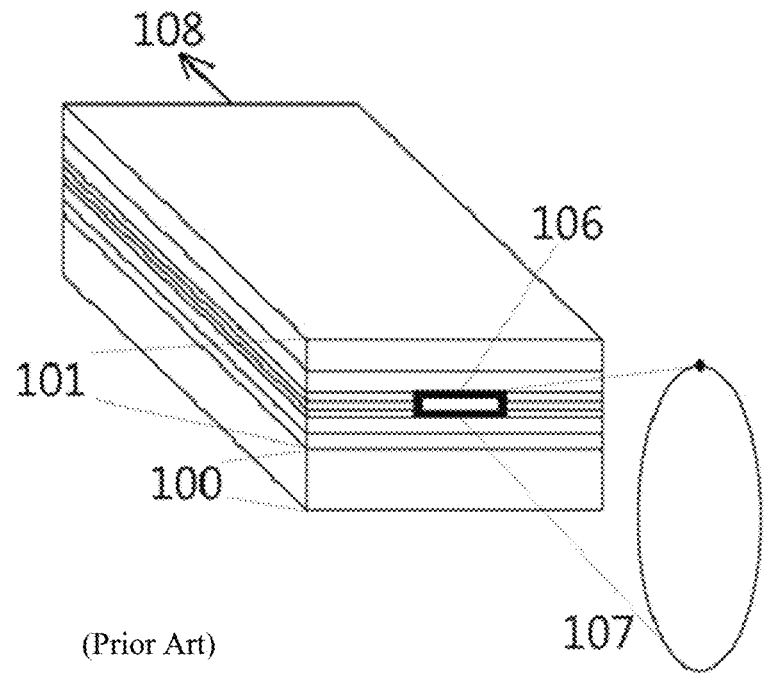
(Prior Art)
Fig. 1B
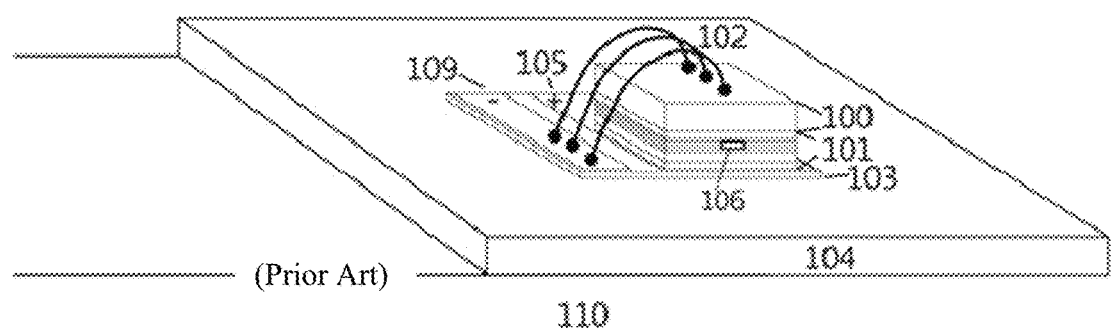
(Prior Art)
Fig. 1

Fig. 2A
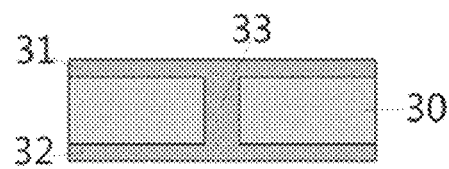
Fig. 2B
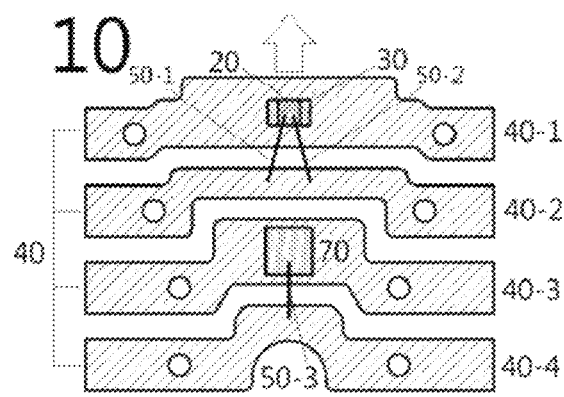
Fig. 2C
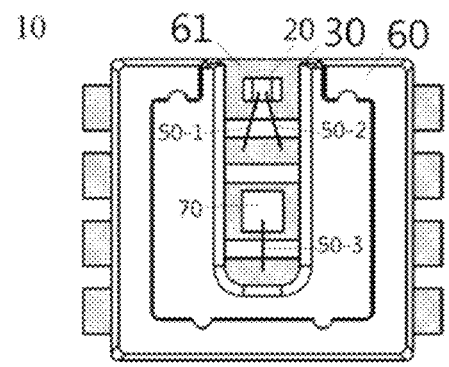
Fig. 2D
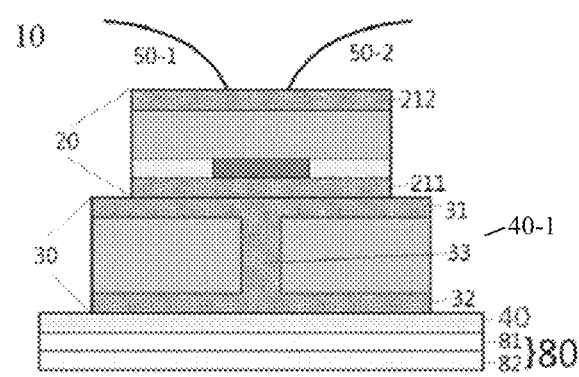
Fig. 2

Fig. 3A
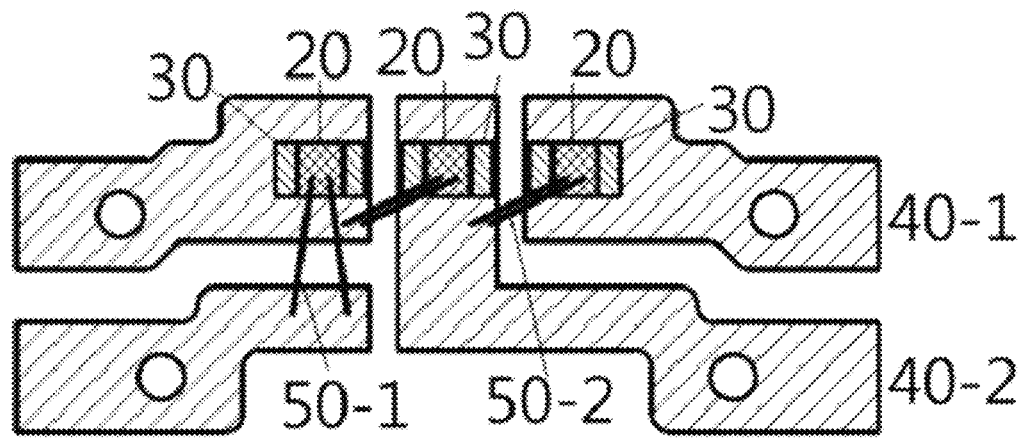
Fig. 3B
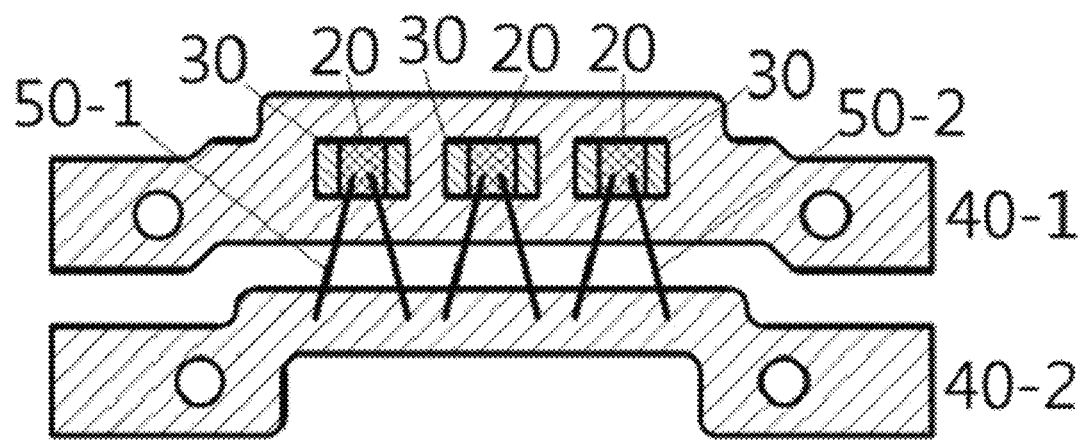
Fig. 3

Fig. 4A
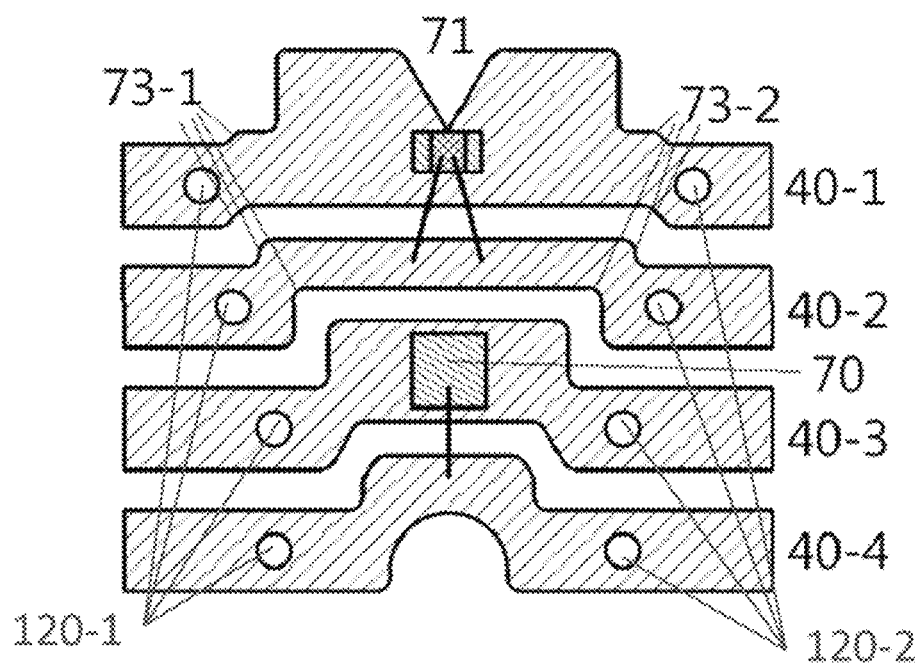
Fig. 4B
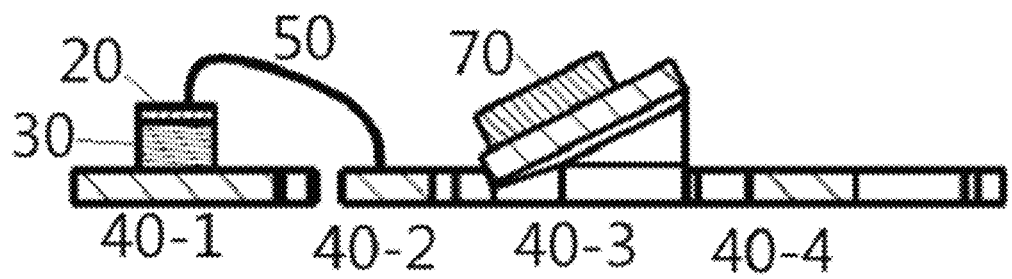
Fig. 4

LASER DIODE SURFACE MOUNTING STRUCTURE

The present application claims priority to Chinese Patent Application No. CN201810564844.7, filed on Jun. 4, 2018 which is incorporated herein by reference in its entirety.

FIELD OF THE INVENTION

The present disclosure relates to a laser diode surface mounting structure, especially to an edge-emitting laser diode package structure using surface mounting technology (SMT), which meets the requirements of high current, high heat dissipation capacity and no thermal stress.

BACKGROUND OF THE INVENTION

The package structure of a conventional edge-emitting medium and high power (output power greater than 50 mW) laser diode is shown in FIG. 1, including FIG. 1A and FIG. 1B, where FIG. 1A shows the structure of a laser diode chip, and FIG. 1B shows the package structure of a conventional laser diode. Referring to FIG. 1A, the laser diode chip is structurally based on a substrate (100), and then atoms are deposited on the substrate by various deposition methods to form an epitaxial layer (101). The epitaxial layer (101) for a red or near-infrared (0.7~1.1 µm) laser diode is usually deposited on a substrate of gallium arsenide (GaAs) crystal. The epitaxial layer (101) for an infrared (1.1~1.9 µm) laser diode is usually deposited on a substrate of indium phosphide (InP) crystal. These substrates are provided for heat dissipation and mechanical support and their thickness is about 0.3 mm. The epitaxial layer (101) is a compound of arsenic, gallium, indium, phosphorus, aluminum or other elements of the III-V family, comprising nearly ten sub-layers of different compositions and with total thickness of about 1 µm. A laser cavity (106) is a small cuboid about 50 µm wide and 500 µm long buried in the epitaxial layer (101) and made by lithography, emitting a main laser output cone (107) outwards and a sub laser output cone (108) in a direction opposite to the output direction of the main laser output cone. At the top of the substrate (100) and under the epitaxial layer (101), metal is plated for conducting electricity (not shown in FIG. 1A). Referring to FIG. 1B, it shows a conventional laser diode package structure, in which a laser chip is soldered or glued to a metal layer (105) which is deposited on a heat-dissipating plate (also known as submount, 103), and a bonding wire (102) is connected to the top of the laser chip and another metal layer (109). The metal layers (105 and 109) are used as soldering pads, marked + and − respectively, for connecting electrical wires (not shown) to supply electrical power to the laser diode chip. The heat-dissipating plate (103) is in close contact with an enclosure (104, usually a thin metal plate). Generally, the enclosure (104) is glued to the heat-dissipating plate (103) for a medium power laser diode, and soldered to the heat-dissipating plate (103), which is plated by metal on both sides, for a high power laser diode. The enclosure (104) is closely contacted with a heatsink (110) to further dissipate heat. In the conventional package structure, the electrical current flows in and out by additional lead wires to the laser diode chip via the metal layers (105, 109) marked + and −. The heat generated from the laser cavity is conducted from the heat dissipating plate (103) and the enclosure (104) to the heat sink (110). At the interface between such as the epitaxial layer (101) and the heat-dissipating plate (103), made of materials with different coefficients of thermal expansion, the thermal stress will be generated and distort the crystal lattice, and hence decrease the laser generation efficiency, quality and life. This is a technical barrier that should be overcome for medium and high-power lasers. To implement a high-power edge-emitting laser diode, both high current and high heat dissipation capacity need to be provided concurrently. There are four factors should be taken into consideration. Firstly, the heat is mainly generated at the laser cavity (106) and must be dissipated quickly, but the substrate is too thick and its thermal conductivity is too low. Therefore, most of conventional laser diode chips are mounted with their epitaxial layer (101) attached to the heat-dissipating plate (103) in order to shorten the pathway to dissipate the heat. Secondly, the coefficient of thermal expansion of the heat-dissipating plate (103) is preferred to be close to that of the epitaxial layer (101). Otherwise, the thermal stress is generated and the crystal lattice of the epitaxial layer (101) is distorted, greatly reducing the efficiency and life of the laser cavity (106). Thirdly, to avoid the thermal stresses, soft materials may also be interposed between the epitaxial layer (101) and the heat-dissipating plate (103), such as indium or silver glue, to absorb the deformation caused by the thermal expansion on both sides. However, such materials are not perfect. For example, the indium is easily oxidized to become hard, and the electrical conductivity of the silver glue is not high enough, rendering voids being generated after heating, resulting in a barrier to heat and current, and hence both materials are unable to withstand high current. Fourthly, part of the heat will still be dissipated through the bonding wires (102). That is, if the bonding wires are located asymmetrically on the chip, the thermal stress will be generated.

Therefore, the conventional laser diode chip structure is unable to simultaneously meet the requirements of high current, high heat-dissipation capacity and low heat stress as described above. Therefore, it leaves a large space for improvements. It will further be explained as follows.

U.S. Pat. No. 5,825,054A uses silicon for a heat-dissipating plate. Although silicon is a semiconductor and thus electrically conductive, it has a much lower conductivity than metal. The thermal conductivity of silicon is 149 W/(m·K) and its thermal expansion coefficient is 2.6 ppm/° C., while the thermal conductivity and thermal expansion coefficient of aluminum nitride (AlN) are 285 and 4.5, respectively. The thermal expansion coefficient of aluminum nitride is closer to gallium arsenide (GaAs, 6.86) and to indium phosphide (InP, 4.60) and has much better thermal conductivity. In this patent, heat is dissipated by a very long insertion-typed lead, the pathway is too long for high power laser diodes (greater than 100 mW).

DE 10 2015 114 292 A1 discloses two embodiments. The laser chip is directly placed on the lead in the first embodiment and placed on FR4 or ceramic PCB in the second embodiment. Although copper is good conductor of heat and electricity, its expansion coefficient, 16.5, is much larger than 6.86 of gallium arsenide, and thus it is unlikely to be applied to high power laser diodes. U.S. Pat. No. 9,379,517B2 does not use a heat-dissipating plate, and thus it cannot carry a laser chip with a large heat dissipation capacity.

In U.S. Pat. No. 9,728,935, metal is plated on the top and bottom surfaces and two sides of an aluminum nitride heat-dissipating plate for passing through electrical current. However, the thickness of the plated gold is limited, and the current path is too long. Thus, it is not suitable for medium and high power laser diodes.

U.S. Pat. No. 8,130,807 discloses a laser diode structure with tungsten-copper alloy (CuW) as the heat-dissipating plate. Although the thermal expansion coefficient of CuW, 6.5 ppm/° C. (taking W90Cu10 alloy as an explanatory example), is close to 6.86 ppm/° C. of gallium arsenide, its thermal conductivity, 170 W/m·K, is lower than 285 W/m·K of aluminum nitride, and hence the patent is not good enough for high power application.

US2018/0062346A1 discloses a structure which connects a plurality of laser diodes serially by wire bonding, in which conventional aluminum nitride heat-dissipating plates are used. The plates are gold-plated on the top and bottom sides, and thus do not conduct electricity directly from the top side to the bottom side. With such a structure, the wires bonded on heat-dissipating plates are asymmetrically arranged on single side, thus thermal stress is inevitable.

Thus, the currently available package structures of the laser diodes still have many drawbacks as described above. The present invention is developed to solve the above problems by proposing one novel package structure.

SUMMARY OF THE INVENTION

The present invention relates to a laser diode surface mounting structure, comprising:

at least one edge-emitting laser diode chip, including two electrodes having an anode and a cathode;

a heat-dissipating plate for carrying one of the two electrodes of the at least one edge-emitting laser diode chip, which comprises a top conductive layer, a bottom conductive layer, and at least one conductive through hole extending from the top conductive layer to the bottom conductive layer for electrical conduction;

two or more metal plates spaced apart from each other and located on a plane, wherein a first metal plate is located under the heat-dissipating plate and in contact with the bottom conductive layer of the heat-dissipating plate, and a second metal plate is located adjacent to and separated from the first metal plate, wherein the second metal plate is electrically connected, via at least one bonding wire, to the other electrode of the two electrodes of the at least one edge-emitting laser diode chip that is not carried by the heat-dissipating plate; and an insulating frame having an opening and being disposed above the two or more metal plates for holding the two or more metal plates, wherein the opening is provided for passing through laser beams emitted from the at least one edge-emitting laser diode chip.

BRIEF DESCRIPTION OF THE DRAWINGS

FIG. 1 includes FIG. 1A and FIG. 1B. FIG. 1A shows the structure of a conventional laser diode chip, and FIG. 1B shows the structure of a conventional surface mounting package for a medium or high power edge-emitting laser diode.

FIG. 2, including FIG. 2A, FIG. 2B, FIG. 2C, and FIG. 2D, shows a structure of the surface mounting package for an edge-emitting laser diode according to the present invention. FIG. 2A is a side view of a heat-dissipating plate, FIG. 2B is a top view of the structure of the surface mounting package, where the insulating frame is removed for better viewing, FIG. 2C is a top view of the structure of the surface mounting package with an insulating frame, and FIG. 2D is a side view of the combination of the laser diode chip, the heat-dissipating plate and the printed circuit board.

FIG. 3, including FIG. 3A and FIG. 3B, shows a connection circuit diagram of a plurality of laser diode chips installed in the structure of the surface mounting package according to the present invention. FIG. 3A shows a parallel connection of three laser diode chips, and FIG. 3B shows a series connection of three laser diode chips.

FIG. 4 includes FIG. 4A and FIG. 4B. FIG. 4A shows a top view of the third metal plate carrying an accessory electronic component, and FIG. 4B shows a side view of the tilted third metal plate carrying an accessory electronic component, disclosed by the present invention.

DETAILED DESCRIPTION OF THE INVENTION

Figure 5:
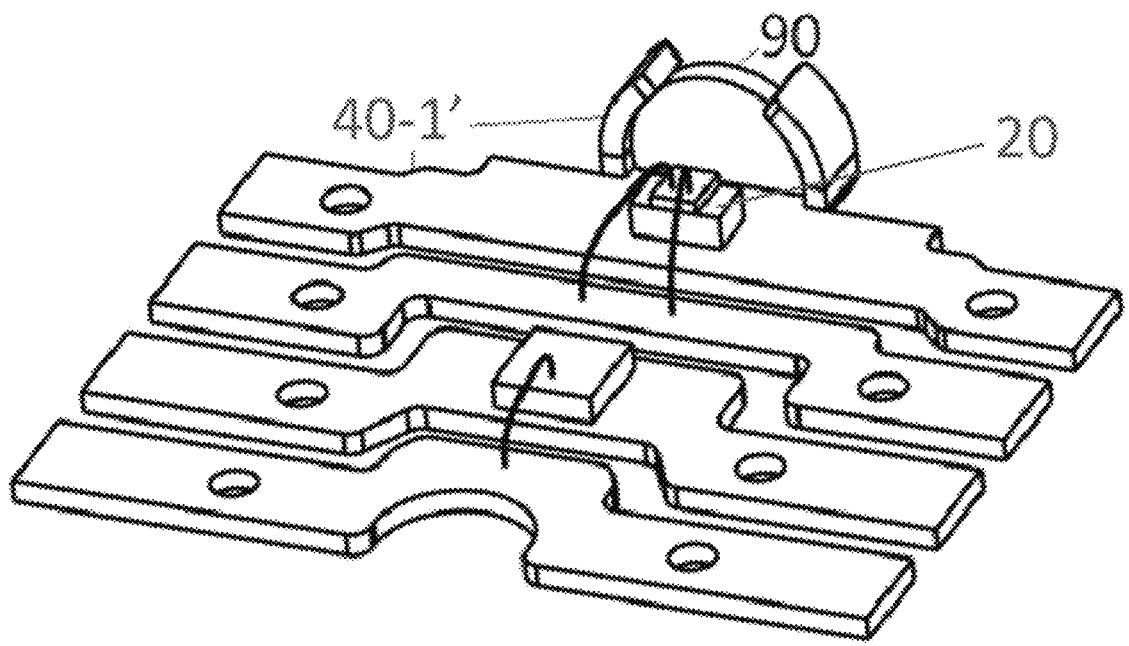
FIG. 5 shows an optical component held by a folded metal plate.

An object of the present invention is to provide a surface mounting package structure for an edge-emitting laser diode so as to give large heat dissipation capacity for the edge-emitting laser diode. The heat is mainly generated from the laser resonant cavity embedded in an epitaxial layer and must be rapidly dissipated in order to avoid thermal stress applied to the epitaxial layer. The thermal stress is avoided by providing a heat-dissipating plate with a similar thermal expansion coefficient in contact with the epitaxial layer to carry large current, and to meet with the requirement of disposing the bonding wires symmetrically on the laser diode chip. Such a surface mounting package structure is proposed to provide large current, large heat dissipation capacity, and low thermal stress to a laser diode, thereby overcoming the drawbacks encountered in the conventional package structures.

A further object of the present invention is to provide a surface mounting package structure for a medium or high-power laser diode for dissipating heat rapidly and effectively, thereby maintaining higher emission efficiency and longer life time.

According to the present invention, a surface mounting package structure for laser diode is provided, which includes:

a laser diode surface mounting structure comprising:

at least one edge-emitting laser diode chip, including two electrodes having an anode and a cathode;

a heat-dissipating plate for carrying one of the two electrodes of the at least one edge-emitting laser diode chip, which comprises a top conductive layer, a bottom conductive layer, and at least one conductive through hole extending from the top conductive layer to the bottom conductive layer for electrically conducting;

two or more metal plates spaced apart from each other and located on a plane, wherein a first metal plate is located under the heat-dissipating plate and in contact with the bottom conductive layer of the heat-dissipating plate, and a second metal plate is located adjacent to and separated from the first metal plate, wherein the second metal plate is electrically connected to the other electrode of the two electrodes via at least one bonding wire; and an insulating frame having an opening and being disposed above the two or more metal plates for holding the two or more metal plates, wherein the opening is provided for passing through laser beam emitted from the at least one edge-emitting laser diode chip.

According to the present invention, the laser diode chip is carried on the heat-dissipating plate, and the total thickness of the heat-dissipating plate is about 0.3 mm, which is thin enough to dissipate heat and to avoid thermal stress due to differences in thermal expansion coefficient between the laser diode chip and the heat-dissipating plate. The main laser output beam (cone) is emitted outwardly from the front side of the laser diode chip of the package, while the sub laser output beam is emitted in a direction opposite to that of the main laser output beam, and to a photosensitive diode disposed behind the laser diode chip, wherein the intensity of the main laser output beam is about fifty times of the sub laser output beam. To reduce thermal stress, it is preferred that the heat-dissipating plate is made of a material with high thermal conductivity and thermal expansion coefficient close to the laser diode substrate (gallium arsenide or indium phosphide), for example, silicon carbide (thermal expansion coefficient 4.0), aluminum nitride or aluminum oxide (thermal expansion coefficient 7.8). The heat-dissipating plate is plated with thin film conductors at the top and the bottom surfaces (such as gold having a thickness of about several micrometers to avoid thermal stress) to form a top conductive layer and a bottom conductive layer drilled with at least one through hole from the top conductive layer to the bottom conductive layer. The at least one through hole is also plated with conductors, such as gold, to conduct electricity from the top conductive layer to the bottom conductive layer. For better heat dissipation capacity, the heat-dissipating plate can be extended along a left to right and/or a front to rear direction, according to the heat to be dissipated from the laser diode chip it carries. The heat-dissipating plate is placed on a first metal plate at the foremost end, and the main body of the heat-dissipating plate is made of copper plated with tin, having a total thickness of about 0.2 mm, thereby functioning well for both heat dissipation and electricity conduction.

In the present invention, the method for preparing a metal plate is similar to that of preparing a conventional lead frame of an integrated circuit; in other words, it is easy for mass production. The thermal expansion coefficient of copper is 16.5, which is quite different from that of the chip of gallium arsenide or indium phosphide. Thus, copper is not suitable as the metal plate to carry the heating-dissipating plate directly. Therefore, in the present invention, the heat-dissipating plate is made of aluminum nitride or aluminum oxide to carry the chip of gallium arsenide or indium phosphide, and a tin-plated copper metal plate to carry the heat-dissipating plate. Since the thermal expansion coefficients of the aluminum nitride or aluminum oxide and the copper are very different, it is anticipated that there will be a large thermal stress between the heat-dissipating plate and the copper metal plate. However, this thermal stress will neither distort the epitaxial layer nor reduce the laser life, because the aluminum nitride or the aluminum oxide is extremely hard (8 and 9 in Mohs' hardness scale, respectively), while the copper is much softer (3 in Mohs' hardness scale). Thus, the thermal stress will distort the copper instead of the aluminum nitride, and hence the epitaxial layer is not distorted, and laser diode quality is ensured.

The current flows from the first metal plate through the heat-dissipating plate, the laser diode chip, the bonding wire, to the second metal plate. Similarly, other metal plates can also extend along a left to right and/or a front to rear direction according to the heat to be dissipated from the electronic components they carry, for better heat dissipation and electrical carrying capacity. The bonding wires are divided into two groups, one being bonded on the left side and the other being bonded on the right side of the laser diode chip symmetrically to reduce thermal stress. The preferred arrangement of the bonding wires is in a splayed manner to avoid shielding of the sub laser output beam emitted backward to the electronic or optical component located behind the laser diode chip. Since the intensity of a laser beam changes drastically with temperature, the present invention optionally adopts a photosensitive diode disposed behind the laser diode to monitor the intensity. The photosensitive diode is connected to an inverting input of an operational amplifier or a transistor to form a negative feedback light intensity stabilizing circuit, of which all components can be mounted inside the same package. The first metal plate and the second metal plate can be (but not limited to) soldered by surface mounting technology on a surface conductor of a printed circuit board (usually a copper foil), such that the entire laser diode package can be mounted on the circuit board and obtain good electrical and thermal conductivity. Below the surface conductor is the substrate of the printed circuit board, which can be made of conventional FR4 (glass fiber reinforced resin), aluminum, aluminum nitride or aluminum oxide with better heat dissipation capacity. With this structure, most of the heat generated from epitaxial layers of the laser diode chip is directly transmitted to the substrate of the printed circuit board via a thin heat-dissipating plate, a thin and vertically extendable first metal plate, rendering a short heat conduction path and extremely fast heat dissipation speed. The current path is almost as short as the heat conduction path, i.e. from the surface conductor of the printed circuit board, the very thin first metal plate, the very thin heat-dissipating plate, the epitaxial layers where the laser beam is generated, and a bonding wire to the second metal plate. The present invention is not the same as the prior art structures at all. In the prior art structures, another long bonding wire is needed and the parasitic inductance and capacitance are inevitably generated. However, in the present invention, only one short bonding wire is needed, and the parasitic inductance and capacitance are rather low, rendering it be operated at high speed, large current, and high power.

In order to maintain and fix the relative position of all the metal plates, an insulating frame is provided for holding the metal plates. The insulating frame has an opening for the laser beam to be emitted outwardly, accommodates the laser diode and other components, and protects the component from external forces.

A top cover may be added on the top of the insulating frame to protect all the components.

To increase the holding force of the insulating frame on the metal plates, one or more flanges (also called bump-out) may be optionally provided on the metal plate, preferably symmetrical to the central line in order not to generate thermal stress. Most of the conventional metal plates are straight, however, in the present invention, the metal plates have two or more bending to increase the holding force of the insulating frame on the metal plate so that the metal plates are less likely to rotate or be pulled away from the insulating frame.

In order to monitor the output power of the laser diode, a photosensitive diode, a third metal plate and a fourth metal plate may be optionally provided behind the laser diode chip, as described above, and held by the insulating frame. To improve the performance of the laser diode, several electronic components may be optionally provided on the metal plates, as described in the following examples. In the first example, a smaller component is provided, with one pin connected to the first metal plate and the other pin connected to the second metal plate respectively, the same as the laser diode does, and this is suitable for mounting an electrostatic discharge (ESD) protection diode, a reverse bias protection diode, a capacitor and or a surge suppression capacitor to protect the laser diode. In practice, the laser diode is vulnerable to ESD or surge. If a protective component is mounted nearby, the life of the laser diode can be greatly extended. In the second example, a larger component is provided, with one pin connected to the first or the second metal plate and then to one electrode of the laser diode chip, and the other pin connected to other metal plate which is not connected to the laser diode. The second example is suitable for mounting a current sensing resistor or a thermistor to monitor the current and temperature of the laser diode chip. If the component generates heat significantly, it can be considered to be mounted far away from the laser diode chip to maintain the symmetry of heat dissipation. If the electronic component has more pins, such as a MOSFET that drives the laser diode, an integrated circuit or the negative feedback light intensity stabilization circuit, it is still available to add one or more metal plates such that the electronic component can be mounted close to the laser diode to avoid parasitic inductance and capacitance to implement high speed and high current laser pulses.

In order to enhance the performance of the laser diode, one or more optical components may be optionally installed at an outlet end, clamped by an insulating frame. Two grooves are provided on the left and right sides of the opening on the insulating frame to accommodate the edge of the optical element. The beam of the edge-emitting laser diode is inevitably shaped like an elliptical cone with significant astigmatism, which is very unfavorable for precision applications and often necessary to be modified by optical components before it can be applied, for example, by a cylindrical lens or a prism. Moreover, most of the laser applications use collimated beams, so in the present invention a collimating lens (convex lens) can be optionally placed at the outlet end to collimate the divergent light cone into a collimated beam. After becoming a collimated beam, a diffraction grating (or hologram) can be used to produce a specific pattern, or an optical crystal (such as Nd:YAG) can be added to generate solid state laser. By further providing a nonlinear crystal (such as KTiOPO4-KTP, or LiB3O5-LBO, also known as the second harmonic generator), light wave with a half wavelength of the original laser can be generated. By being clamped by the insulating frame, the optical component can be installed very close to the laser chip such that the laser beam can be collimated before spreads widely, so that its diameter can be small and the optical lens and the whole system can be very small, which can greatly expand the range of applications.

For enhancing cooling capacity, the first metal plate can be expanded; however, to prevent the first metal plate from shielding the outward laser beam, a V-shaped cutout can be set on the first metal plate. Thus, a large first metal plate for heat dissipation can be realized without shielding the laser beam. The cutout can also be U-shaped or in other shapes. For example, after the beam is collimated, the cutout can be U-shaped, so that the first metal plate with a larger area can be used for conducting heat.

In order to increase the light receiving area of the photosensitive diode, the middle portion of a third metal plate, which carries the photosensitive diode, may be optionally twisted so that the middle portion and the photosensitive diode it carries are no longer maintained horizontally but tilted at an angle to increase the effective light receiving area. The middle portion of the third metal plate can be bent into an L-shape at the side close to the laser diode to hold and prevent the photosensitive diode from dropping down before being mounted. The lowest part of the twisted middle portion is maintained not lower than the lowest layer of the original metal plate such that it can be surface mounted.

When it is necessary to use the top cover to protect the laser chip and bonding wires, etc., the top cover can also hold one or more optical components, and the top cover can also be made with a groove at the outlet end to accommodate the edge of the optical component(s) and to clamp the optical component(s) between the top cover and the first metal plate.

The optical component can also be held by making a half cut on the metal plate and then folding up to wrap the optical component.

A plurality of laser diode chips can be mounted in the same laser diode package, and the chips can be connected in series or in parallel.

A plurality of laser diode chips can also be connected in series and then in parallel, or connected in parallel and then in series, and mounted in the same laser diode package. By different series and parallel configurations, the power efficiency for a given supply voltage can be optimized.

EXAMPLES

The embodiment of the present invention can be implemented with different content and is not limited to the examples described in the following text. The following examples are merely representative of various aspects and features of the present invention.

FIG. 2, including FIG. 2A, FIG. 2B, FIG. 2C, and FIG. 2D, shows a structure of the surface mounting package for an edge-emitting laser diode according to the present invention. FIG. 2A is a side view of the heat-dissipating plate, FIG. 2B is a top view of the structure of the surface mounting package, where the insulating frame is removed for better viewing, FIG. 2C is a top view of the structure of the surface mounting package with an insulating frame, and FIG. 2D is a side view of the combination of the laser diode chip, the heat-dissipating plate and the printed circuit board. Referring to FIG. 2A, FIG. 2B, FIG. 2C and FIG. 2D, a laser diode surface mounting structure 10 according to the present invention included:

at least one edge-emitting laser diode chip 20, comprising two electrodes 21 having an anode 211 and an cathode 212; a heat-dissipating plate 30, having a top conductive layer 31, a bottom conductive layer 32, and at least one conductive through hole 33 extending from the top conductive layer 31 to the bottom conductive layer 32, for carrying one of the two electrodes 211 or 212 of the at least one edge-emitting laser diode chip 20, wherein one of the at least one conductive through hole 33 was for electrically conducting the top conductive layer 31 and the bottom conductive layer 32; two or more metal plates 40 spaced apart from each other and located on a plane, wherein a first metal plate 40-1 was located under the heat-dissipating plate 30 and in contact with the bottom conductive layer 32 of the heat-dissipating plate, and a second metal plate 40-2 was located adjacent to and separated from the first metal plate, wherein the second metal plate 40-2 was electrically connected, via at least one boding wire 50, to the other electrode 211 or 212 of the two electrodes of the at least one laser diode chip that was not carried by the heat-dissipating plate; and an insulating frame 60 having an opening 61 and being disposed above the two or more metal plates 40 for holding the two or more metal plates, wherein the opening was provided for passing through laser beam emitted from the at least one edge-emitting laser diode chip.

According to the laser diode surface mounting structure 10 of the present invention, the at least one bonding wire 50 were two bonding wires 50-1, 50-2, which were connected to the other electrode 212 or 211 of the at least one edge emitting laser diode 20 that was not carried by the heat-dissipating plate 30, and symmetrically distributed on the left side and the right side of the at least one edge-emitting laser diode chip 20.

As shown in the combination structure of FIG. 2D, the laser diode surface mounting structure 10 according to the present invention was mounted on a printed circuit board 80 which included a substrate 82 and a surface conductor layer 81 coated thereon, wherein the first metal plate 40-1 was soldered onto the surface conductor layer 81. Naturally, the remaining metal plates might also be soldered onto the surface conductor layer 81.

Besides, referring to FIG. 3, the at least one edge-emitting laser diode chip 20 described above was more than one which were connected as a circuit as shown in FIG. 3A. In FIG. 3A, three laser diode chips were connected in a parallel configuration. In FIG. 3B, three laser diode chips were connected in a series configuration. The laser diode chips might be configured to be connected in series and/or parallel as required.

In the present invention, the material of the heat-dissipating plate 30 was aluminum nitride, aluminum oxide or silicon carbide, the material of the two or more metal plates was copper, and the material of the insulating frame was plastic, epoxy or polyoxybenzylmethyleneglycolanhydride (trade name Bakelite).

Further, as shown in FIG. 2, the laser diode surface mounting structure 10 further comprised at least one additional electronic component 70, which might be a photo-sensitive diode, an anti-ESD (electro-static-discharge) diode, a reverse bias protection diode, a capacitor, a transistor, an integrated circuit or a surge suppression capacitor, and connected to a third metal plate 40-3, and further to a fourth metal plate 40-4 via a bonding wire 50-3 for circuit connection, in which the third metal plate and the fourth metal plate were held by the insulating frame.

In the present invention, two sides of each of at least two metal plates 40 had a bump-out 120-1,120-2, (also called a flange) thereon, in which the two bump-outs were disposed symmetrically to the center line. Further, a cutout 71 was provided at a laser beam outlet end of the first metal plate 40-1 for allowing a main laser output cone to pass through, as shown in FIG. 4(a).

FIG. 4A shows a top view and FIG. 4B shows a side view of the third metal plate 40-3 carrying the at least one additional electronic component 70. When it was a photo-sensitive diode, the middle portion of the third metal plate 40-3 was twisted into a tilted surface, as shown in FIG. 4B, wherein the angle between the normal vector of a light receiving surface of the at least one electronic component and the center line of the rear laser light was not 90 degrees, such that the effective light receiving area was increased to cooperate with a feedback control circuit to stabilize the intensity of the laser light. The first metal plate 40-1 was outwardly expanded to enhance the heat dissipation capacity. In addition, the first metal plate 40-1 was provided with a cutout 71 disposed at the laser beam outlet end of the at least one laser diode chip 20 for allowing the main laser output cone to pass through.

The laser diode surface mounting structure 10 of the present invention further included a top cover (not shown in the drawing) for covering the insulating frame. Each of the two or more metal plates spaced from each other had bendings 73-1, 73-2 (but still on the same plane), as shown in FIG. 4A, wherein the bendings 73-1 on the left and 73-2 on the right of the metal plates to increase the holding strength of the insulating frame on each metal plate.

As shown in FIG. 5, the laser diode surface mounting structure 10 of the present invention further comprised an optical element 90, mounted in front of the edge-emitting laser diode 20, which was held by the insulating frame 60, by the top cover, or by a bent first metal plate 40-1', wherein the optical element 90 was a lens, a filter, a diffraction grating, a prism, a polarizer, an optical crystal, or a nonlinear optical crystal, as required by the processing of the beam emitted from the edge-emitting laser diode.

In addition, the at least one additional electronic component 70 of the laser diode surface mounting structure was a light intensity stabilizing circuit.

Those skilled in the art recognize the foregoing outline as a description of the method for communicating hosted application information. The skilled artisan will recognize that these are illustrative only and that many equivalents are possible.

What is claimed is:

1. A laser diode surface mounting structure, comprising: at least one edge-emitting laser diode chip, including two electrodes having an anode and a cathode; a heat-dissipating plate for carrying one of the two electrodes of the at least one edge-emitting laser diode chip, which comprises a top conductive layer, a bottom conductive layer, and at least one conductive through hole extending from the top conductive layer to the bottom conductive layer for electrical conduction; two or more metal plates spaced apart from each other and located on a plane, wherein a first metal plate is located under the heat-dissipating plate and in contact with the bottom conductive layer of the heat-dissipating plate, and a second metal plate is located adjacent to and separated from the first metal plate, wherein the second metal plate is electrically connected, via at least one bonding wire, to the other electrode of the two electrodes of the at least one edge-emitting laser diode chip that is not carried by the heat-dissipating plate; and an insulating frame having an opening and being disposed above the two or more metal plates for holding the two or more metal plates, wherein the opening is provided for passing through laser beams emitted from the at least one edge-emitting laser diode chip, wherein a first metal plate has a cutout at a laser beam outlet end of the at least one edge-emitting laser diode chip for passing through laser light output cone.

2. The laser diode surface mounting structure of claim 1, wherein the at least one bonding wire are two bonding wires which are connected to the other electrode of the at least one edge emitting laser diode that is not carried by the heat-dissipating plate, and symmetrically distributed on the left side and the right side of the at least one edge-emitting laser diode chip.

3. The laser diode surface mounting structure of claim 1, wherein the at least one edge-emitting laser diode chip is more than one, and the more than one edge-emitting laser diode chips are electrically connected in series, in parallel, or a combination thereof to form a circuit.

4. The laser diode surface mounting structure of claim 1, wherein the material of the heat-dissipating plate is aluminum nitride, aluminum oxide or silicon carbide.

5. The laser diode surface mounting structure of claim 1, wherein the material of the two or more metal plates is copper.

6. The laser diode surface mounting structure of claim 1, wherein the material of the insulating frame is plastic, epoxy or polyoxybenzylmethyleneglycolanhydride.

7. The laser diode surface mounting structure of claim 1, further comprising at least one additional electronic component.

8. The laser diode surface mounting structure of claim 7, wherein the at least one additional electronic component is a photosensitive diode, an electrostatic discharge protection diode, a reverse bias protection diode, a capacitor, a transistor, an integrated circuit, or a surge suppression capacitor, and the at least one additional electronic component is connected to one metal plate which is to be electrically connected to other component of a circuit, in which the metal plate to which the circuit is connected is held by the insulating frame.

9. The laser diode surface mounting structure of claim 8, wherein the metal plate to which the at least one additional electronic component is connected is provided with a tilted surface at a portion of the third metal plate for carrying the at least one additional electronic component such that a normal vector of a light receiving surface of the at least one additional electronic component forms an angle other than 90 degree with respect to a center line of laser light output cone.

10. The laser diode surface mounting structure of claim 1, wherein at least one of the two or more metal plates has a flange thereon.

11. The laser diode surface mounting structure of claim 1, further comprising a top cover for covering the insulating frame.

12. The laser diode surface mounting structure of claim 11, further comprising an optical component held by the top cover.

13. The laser diode surface mounting structure of claim 1, wherein each of the two or more metal plates spaced from each other has a bending in order to increase the strength of the insulating frame for holding the metal plates.

14. The laser diode surface mounting structure of claim 1, further comprising an optical component held by the insulating frame.

15. The laser diode surface mounting structure of claim 1, further comprising an optical component held by a bended metal plate.

16. The laser diode surface mounting structure according to claim 14, 12 or 15, wherein the optical component is a lens, a filter, a diffraction grating, a prism, a polarizer, an optical crystal, or a nonlinear optical crystal.

17. The laser diode surface mounting structure of claim 1, further comprising a printed circuit board having a body and a surface conductor layer on the top side of the body, wherein the first metal plate is in contact with the surface conductor layer.

18. A laser diode surface mounting structure, comprising: at least one edge-emitting laser diode chip, including two electrodes having an anode and a cathode; a heat-dissipating plate for carrying one of the two electrodes of the at least one edge-emitting laser diode chip, which comprises a top conductive layer, a bottom conductive layer, and at least one conductive through hole extending from the top conductive layer to the bottom conductive layer for electrical conduction; two or more metal plates spaced apart from each other and located on a plane, wherein a first metal plate is located under the heat-dissipating plate and in contact with the bottom conductive layer of the heat-dissipating plate, and a second metal plate is located adjacent to and separated from the first metal plate, wherein the second metal plate is electrically connected, via at least one bonding wire, to the other electrode of the two electrodes of the at least one edge-emitting laser diode chip that is not carried by the heat-dissipating plate; and an insulating frame having an opening and being disposed above the two or more metal plates for holding the two or more metal plates, wherein the opening is provided for passing through laser beams emitted from the at least one edge-emitting laser diode chip, and wherein at least one additional electronic component is provided and one metal plate to which the at least one additional electronic component is connected is provided with a tilted surface at a portion thereof, such that a normal vector of a light receiving surface of the at least one additional electronic component forms an angle other than 90 degree with respect to a center line of laser light output cone.

* * * * *